United States Patent [19]

Candy et al.

[11] 4,356,559

[45] Oct. 26, 1982

[54] LOGIC ARRANGEMENT FOR RECURSIVE DIGITAL FILTER

[75] Inventors: James C. Candy, Middletown; Bruce A. Wooley, Tinton Falls, both of N.J.

[73] Assignee: Bell Telephone Laboratories, Incorporated, Murray Hill, N.J.

[21] Appl. No.: 174,516

[22] Filed: Aug. 1, 1980

[51] Int. Cl.³ .............................................. G06F 15/34
[52] U.S. Cl. ................................................ 364/724
[58] Field of Search .............................. 364/724, 745

[56] References Cited

U.S. PATENT DOCUMENTS

| | | | |
|---|---|---|---|
| 3,676,654 | 7/1972 | Melvin | 364/724 |
| 3,714,402 | 1/1973 | Baumwolspiner | 364/724 |
| 3,749,895 | 7/1973 | Kao | 364/745 |
| 3,959,637 | 5/1976 | Nussbaumer | 364/724 |
| 3,982,112 | 9/1976 | Schlereth | 364/745 |
| 3,997,770 | 12/1976 | Claasen et al. | 364/724 |
| 4,021,654 | 5/1977 | Harris et al. | 364/724 |
| 4,034,196 | 7/1977 | Butterweck et al. | 364/745 |
| 4,034,197 | 7/1977 | Lawrence et al. | 364/724 |
| 4,215,415 | 7/1980 | Kanemasa et al. | 364/724 |
| 4,223,389 | 9/1980 | Amada et al. | 364/724 |
| 4,317,092 | 2/1982 | Potter | 333/165 |

OTHER PUBLICATIONS

"Pulse Code Modulation (PCM) of Voice Frequencies", *CCITT* Recommendation G. 711, Geneva, 1972, pp. 372-377.

*Primary Examiner*—David H. Malzahn
*Attorney, Agent, or Firm*—Barry H. Freedman

[57] ABSTRACT

A digital filter includes a pair of serially connected second order sections (200 and 260), each of which includes delay elements arranged to store the number of bits contained in two complete input words. Each filter section also includes simple logic (220, 230, 270 and 280) comprising adder circuits and inverters but no multipliers. The logic combines outputs from the delay element with the filter input to form an intermediate signal which is applied to the input of the delay element. The intermediate signal is also combined with yet other outputs from the delay element to form the filter output. To eliminate clocking complexity within the filter, the logic is not preset or cleared between each input word. Instead, the word length is intentionally increased, and the sign bit of each intermediate word is intentionally repeated as the word is processed in the filter, the extra bits acting as an inter-word buffer and serving to protect against spurious overflow and limit cycle oscillations.

14 Claims, 7 Drawing Figures

LOGIC ARRANGEMENT FOR RECURSIVE DIGITAL FILTER

TECHNICAL FIELD

This invention relates generally to digital filters and, more particularly, to a recursive digital filter intended for use in the audio band.

BACKGROUND OF THE INVENTION

The design of digital filters for use in telephony as well as in other audio band applications is a well-documented science. Procedures have been established for "optimizing" a filter structure while maintaining its spectral response within specified bounds. The "optimum" is generally taken to mean a structure with a minimum number of certain types of operations, such as multiplication or addition. However, an optimized general purpose filter may be far from ideal where a single-chip integrated circuit implementation is desired, particularly in dedicated applications where the filter coefficients are fixed.

Besides the difficult tradeoffs that must be made between the number of circuit elements, arithmetic complexity and flexibility, other problems exist in the filter design process. Integrated circuit technology has progressed to the point where the area required for elements such as gates, registers, and simple arithmetic operators can be very small. Unless great care is taken, a large fraction of the chip area may be devoted simply to interconnections. Clock generation and distribution are particularly troublesome in this regard. Seemingly simple circuits may require the distribution of a large number of clocks to many points. The area needed to generate these clocks, keep them aligned with the data, and distribute them can substantially exceed the area consumed by the signal path. Moreover, such circuits can be especially difficult to diagnose and test.

In view of the above concerns, it is an object of the present invention to design a basic filter that is particularly well suited to efficient integrated circuit implementation. Both the arithmetic and storage functions in the filter are desirably provided using only a small number of simple circuit elements, without the need for multiplier circuits. A further object is a filter arrangement which minimizes the number of interconnections among various elements of the filter. Desirably, only a few clock signals must be distributed within the filter.

SUMMARY OF THE INVENTION

A low-pass filter in accordance with the invention comprises a pair of second-order filter sections in cascade, each filter section operating at a word rate somewhat higher than the desired output rate, followed by an accumulate and dump circuit that lowers the sampling rate to the desired output frequency. While not limited to any specific application, the filter is particularly useful in preventing aliasing in a decimation circuit in which a high sample rate input is converted to a lower sample rate output. The transfer function for the filter is given by:

$$H(z) = \frac{1}{8}\left[\frac{1 - \frac{5}{4}z^{-1} + z^{-2}}{1 - \frac{19}{16}z^{-1} + \frac{31}{64}z^{-2}}\right]\left[\frac{1 - \frac{3}{4}z^{-1} + z^{-2}}{1 - \frac{23}{16}z^{-1} + \frac{55}{64}z^{-2}}\right]$$

while the transfer function for the accumulator is $$H_A(z) = \frac{1}{4}\left[\frac{1 - z^{-4}}{1 - z^{-1}}\right]$$

Each filter section includes two serially connected multi-bit delay elements each comprised of a serial string of one-bit delay registers sufficient to store at any time the number of bits contained in a complete word. Each section also includes logic which comprises arithmetic (adder) circuits and inverters, but no multipliers. The logic combines outputs from the delay element to form intermediate signals which are combined with the input to yield the desired output. To eliminate clocking complexity nd simplify the filter, the carry registers associated with the adder circuits are neither preset nor cleared between input words. Instead, the length of each input word which is presented in two's complement format is intentionally increased, and the sign bit is repeated a preselected number of times as each word is processed in each filter section. Any errors that occur due to carry inaccuracy are less significant than the quantization noise associated with the input word and thus do not materially affect the filter output.

BRIEF DESCRIPTION OF THE DRAWING

The present invention will be more fully appreciated by consideration of the following detailed description when read in light of the accompanying drawing in which.

DETAILED DESCRIPTION

Figure 1:
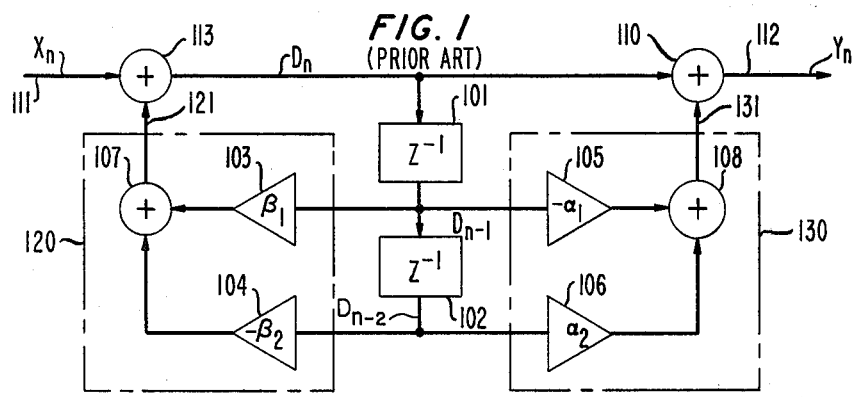
FIG. 1 is a block diagram of a prior art second-order recursive digital filter.

One common prior art second-order recursive digital filter is illustrated in block diagram form in FIG. 1. The filter includes first and second delay elements 101 and 102, respectively, each of which is arranged to provide a total delay equal to the length of each input word. The designation "second order" filter is derived because of the two-word total delay for elements 101 and 102 used in the filter.

The output of delay element 101 is a first intermediate signal $D_{n-1}$ (sometimes called a "state variable") which is applied to a feedback multiplier 103 and a feedforward multiplier 105. Similarly, the output from delay element 102 is a second intermediate signal $D_{n-2}$ which is applied to a feedback multiplier 104 and a feedforward multiplier 106. The relationship between the input to delay element 101 (another state variable denominated $D_n$) and its output $D_{n-1}$ is expressed, in z-transform notation, as:

$$D_{n-1} = z^{-1}(D_n) \qquad (1)$$

where the operation $z^{-1}$ indicates a delay by one word interval. Similarly, the input/output relationship for delay element 102 is given by:

$$D_{n-2} = z^{-1}(D_{n-1}). \qquad (2)$$

Equations (1) and (2) are combined such that:

$$D_{n-2} = z^{-2}(D_n), \qquad (3)$$

where $z^{-2}$ indicates a dealy by two word intervals. Each of the multipliers 103–106 is arranged to multiply its input by a preselected coefficient value which determines the desired poles and zeros of the filter. The coefficients for multipliers 103 and 104 are conventionally designated $\beta_1$ and $-\beta_2$, respectively, and the outputs of these multipliers are combined in an adder 107 to form a feedback signal on line 121. The coefficients for multipliers 105 and 106 are designated $-\alpha_1$ and $\alpha_2$, respectively, and the outputs of these multipliers are combined in an adder 108 to form a feedforward signal on line 131. The output of adder 107 is combined in adder 113 with the filter input $X_n$ on line 111 to yield the state variable $D_n$, which is applied both to delay element 101 and to one input of adder 110. The output from adder 108 is combined in adder 110 with $D_n$ to yield the overall filter output $Y_n$ on line 112.

For a series of input words designated $X_{n-1}, X_n, X_{n+1}, \ldots$ a series of equations govern the operation of the filter of FIG. 1, as follows:

$$Y_{n-1} = X_{n-1} + (\beta_1 - \alpha_1)D_{n-2} + (\alpha_2 - \beta_2)D_{n-3} \qquad (4)$$

$$Y_n = X_n + (\beta_1 - \alpha_1)D_{n-1} + (\alpha_2 - \beta_2)D_{n-2} \qquad (5)$$

$$Y_{n+1} = X_{n+1} + (\beta_1 - \alpha_1)D_n + (\alpha_2 - \beta_2)D_{n-1} \qquad (6)$$

The recursions specified in equations (4) through (6) can be combined and simplified so that the overall filter response is expressed in the z-transform domain, as follows:

$$H(z) = \frac{Y_n}{X_n} = \frac{1 - \alpha_1 z^{-1} + \alpha_2 z^{-2}}{1 - \beta_1 z^{-1} + \beta_2 z^{-2}} \qquad (7)$$

As seen from equation (4), the values of $\beta_1$ and $\beta_2$ determine the poles of the filter, while $\alpha_1$ and $\alpha_2$ determine the zeros.

The multipliers and certain of the adder circuits in the filter of FIG. 1 can be grouped together, for descriptive purposes, in logic circuits 120 and 130, each of which receive outputs from the delay elements 101 and 102 and which form the feedback and feedforward signals on lines 121 and 131, respectively. The former is combined with the input $X_n$ to yield the state variable called $D_n$ and the latter is combined with $D_n$ to yield the overall filter output $Y_n$. In actual implementations, the multipliers found within logic circuits 120 and 130 are usually time shared, so that a single multiplier can replace multipliers 103 through 106. With this arrangement, coefficients $-\alpha_1$, $\alpha_2$, $\beta_1$ and $-\beta_2$ are serially applied to the common multiplier which provides the desired products one at a time. Such time sharing, while more efficient than the use of individual multipliers in some respects, suffers from complexity in routing of signals and delivery of coefficient values from memory, and other difficulties which are desirably avoided in the filter of the present invention.

Figure 2:
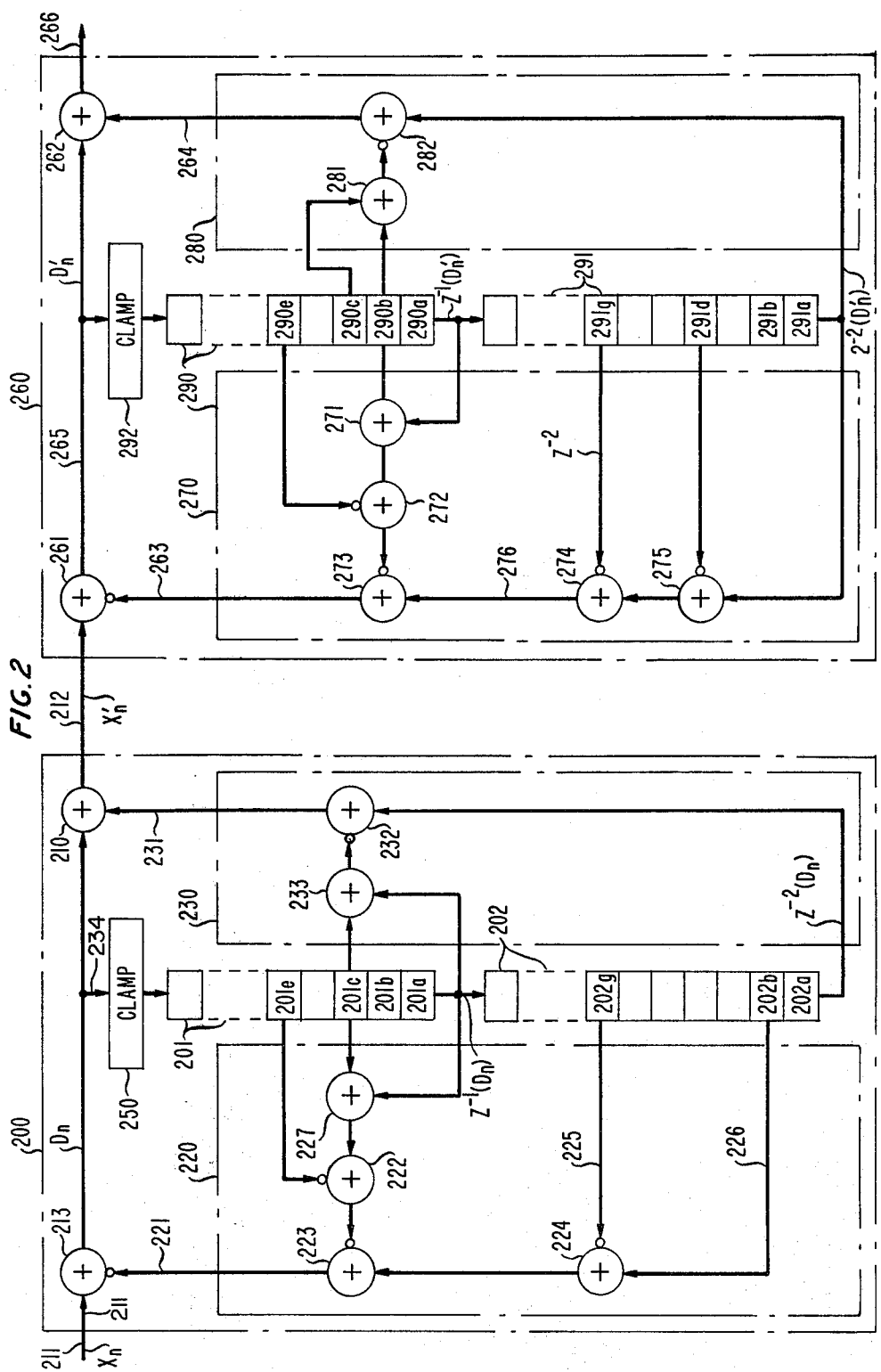
FIG. 2 is a generalized block diagram of a cascade of two second-order recursive digital filter sections constructed in accordance with the present invention.

As shown in FIG. 2, each section of a two-section filter constructed in accordance with the present invention is topologically similar to the filter of FIG. 1. In the first section 200, delay elements 201 and 202, each of which is a multi-bit shift register, are serially connected and provide inputs to logic circuits 220 and 230 which include only adder circuits and inverters. Logic 220 forms a feedback signal on line 221, and logic 230 forms a feedforward signal on line 231. The feedback signal is combined in adder 213 with the filter input on line 211 to form the state variable $D_n$, and the feedforward signal is combined with $D_n$ in adder 210 to yield the output (designated $X'_n$) of filter section 200 on line 212. In accordance with the invention, the variable $D_n$ is applied to delay element 201 via a clamp circuit 250 inserted in line 234 which connects the output of adder 213 to the input of delay element 201. Clamp 250 is arranged to preset a preselected number of the bits in each word to a value corresponding to the sign of that word. This string of sign bits serves as a buffer or separation between adjacent words, and enables the carry circuits within the adders in logic 220 and 230 to operate without being preset at the beginning of each word. Also, the string of sign bits is arranged so as to protect against anomalous overflow and limit cycle oscillations such as might occur during turn-on transients. Filter section 260 also includes a clamp circuit 292 connected to line 265 which presets bits in each word output from adder 261 in accordance with the sign bit of the word and applies the result to delay element 290.

For the one-bit adder circuits in FIG. 2 only two inputs and the sum output are shown explicitly. However, these circuits are presumed to include a carry output, a carry input and a one-bit carry register. The carry register associated with each adder is clocked at the bit rate $f_b$ of the input signal. The carry output of the adder is clocked into and thus stored in the carry register for that adder, and then serves as the carry input for the succeeding bit. Between words, the carry registers are neither preset nor cleared, thereby eliminating the need for the distribution of an additional clock to the adder circuits. Any resulting errors are less significant than the quantization error inherent in the filter input, because the significant signal bits are appropriately positioned within each word, as explained below.

Subtraction in the filter of FIG. 2 is performed simply by the inversion of an adder input. Two's complement subtraction normally entails not only bit-by-bit inversion, but also the addition of a ONE to the least significant bit of the subtrahend. By neglecting this added ONE, the need for an additional clock is eliminated. The resulting error in the subtraction is comparable to that resulting from the lack of a carry clear or preset between words, since both involve only the least significant bit. The error is thus less significant than the quantizing noise inherent in the signal and does not materially affect the filter output.

The timing required in the filter of FIG. 2 is also quite simple. Delay elements 201 and 202 advantageously comprise a serial chain of one bit shift registers which are arranged to store the number of bits in each input word. The arithmetic circuits in logic 220 and 230 and the shift registers in delay elements 201 and 202 are all clocked at the bit rate $f_b$ of the input signal, while clamp 250 is clocked at a word rate $f_b/m$, where m is the bit length of the input words. No other clocks are required in the filter of FIG. 2, enabling simple fabrication and efficient operation.

Figure 3:
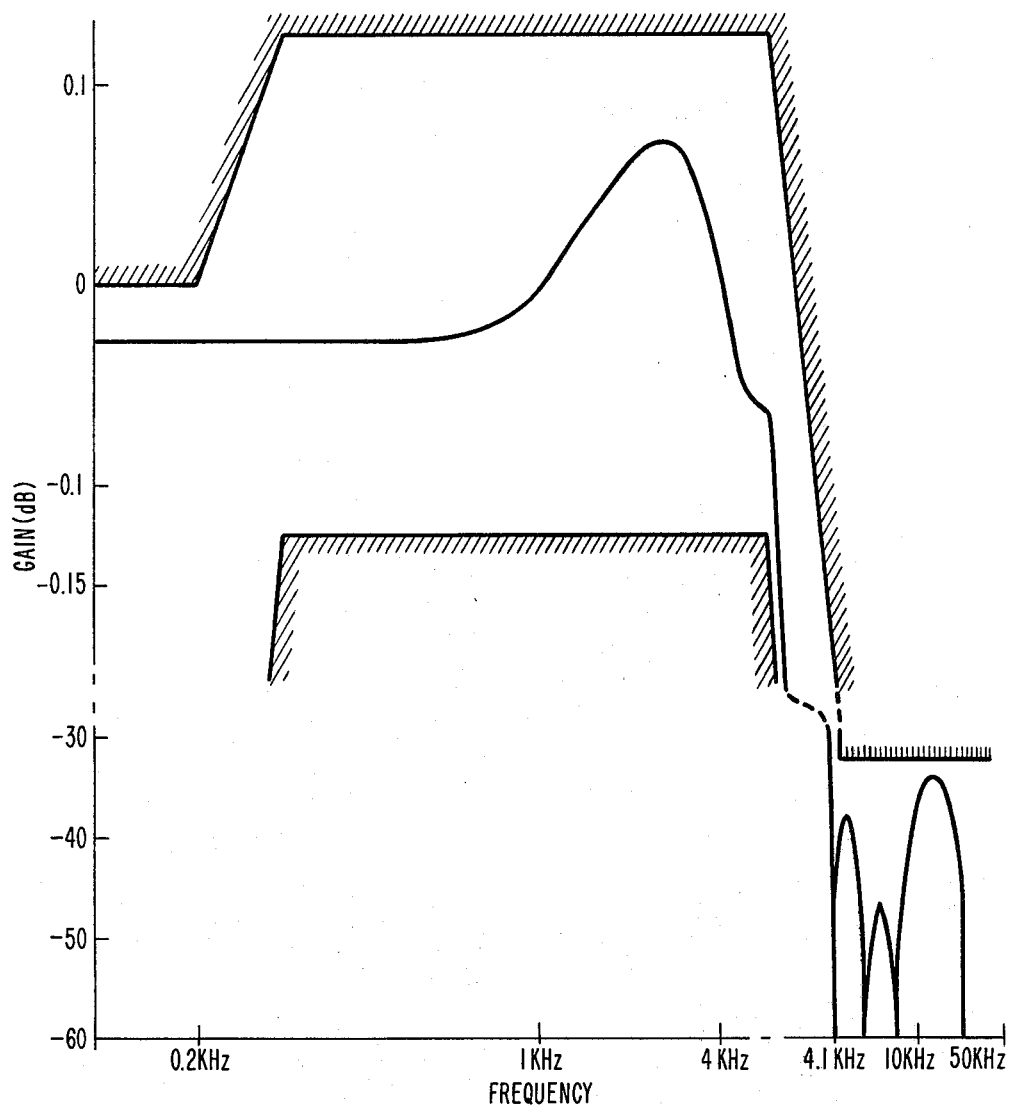
FIG. 3 illustrates the frequency response characteristics of a low-pass filter constructed in accordance with the present invention.

The particular arrangement used for logic 220 and 230, and the logic within the second filter section 260, depends upon the transfer characteristics needed for a given application. For telephone applications, a flat ($\pm 0.12$ dB) inband response between 300–3000 Hz is required. The filter desirably cuts off sharply between 3.5 and 4.5 kHz, and provides at least 32 dB attenuation above this frequency. An illustration of a typical frequency response characteristic for a low-pass filter constructed in accordance with the present invention is shown in FIG. 3. More detail concerning the requirements for this type of filter can be obtained in published specifications, such as "Pulse Code Modulation of Voice Frequencies", *CCITT*, Rec. G. 711, Geneva, 1972; amended at Geneva, 1976.

To achieve the response shown in FIG. 3, the present invention utilizes an accumulate and dump circuit shown in FIG. 4 and described in more detail below, in cascade with a two-section filter of the type shown in FIG. 2. The two-section filter requires coefficient precision of only six bits, and has an overall z-transform given by:

$$H(z) = \frac{1}{8} \left[ \frac{1 - \frac{5}{4}z^{-1} + z^{-2}}{1 - \frac{19}{16}z^{-1} + \frac{31}{64}z^{-2}} \right] \left[ \frac{1 - \frac{3}{4}z^{-1} + z^{-2}}{1 - \frac{23}{16}z^{-1} + \frac{55}{64}z^{-2}} \right] \quad (8)$$

while the accumulate and dump circuit has a z-transform given by:

$$H_A(z) = \frac{1}{4} \left[ \frac{1 - z^{-4}}{1 - z^{-1}} \right] \quad (9)$$

The terms within the first bracket in equation (8) are implemented by section 200, while filter section 260 has a response described by the terms in the second bracket. Within section 200, logic 220 forms the poles of the filter in the denominator of the first bracket fraction, while logic 230 develops the zeros in the numerator. Different logic is used in section 260 to develop the poles and zeros specified in equation (8). While not absolutely essential, it is advantageous to deploy filter sections 200 and 260 in the order shown, rather than reversing the positions. This occurs due to differences in the dynamic range of signals in the sections, brought about by the differences in gain.

Input words are applied to delay element 201 via clamp 250, least significant bit first, with the words being in two's complement format. With this arrangement, an output taken from a particular register within a delay element which precedes a reference output taken from a register further along in the delay element will have a value which is a fraction $(\frac{1}{2})^d$ of the reference output, where d is the number of bits which separate the outputs. Several examples will illustrate this property. Referring to delay element 201, which is made up of individual one-bit registers designated 201a, 201b . . . , if the output from the last register 201a is considered a reference output, then the output from the immediately preceding register 201b is reduced by a factor $\frac{1}{2}$, while the output from the next preceding register 201c is $(\frac{1}{2})^2 = \frac{1}{4}$ of the reference output, since d=2. This factoring occurs because extraction of a number (on a bit-by-bit basis) from a register preceding a reference register amounts to shifting the output to the right by the number of bits which separate the registers. Each rightward bit shift, of course, amounts to reduction of the value involved by the factor $\frac{1}{2}$. The filter of FIG. 2 is said to have 6-bit coefficients, since the logic circuits within each filter section receive inputs from registers which preceed the reference output by no more than six bits.

With the above properties in mind, it is seen from FIG. 2 that the arrangement of logic 220 and 230 is designed to produce the poles and zeros, respectively, specified in the first term of equation (8). Specifically, the output from the last register 201a of delay element 201 is combined with the output from the third from last register 201c in adder 227. The sum thus produced is $(5/4)z^{-1}(D_n)$, since the output from register 201c is $\frac{1}{4}$ of that from register 201a, the latter being $z^{-1}(D_n)$. The output from register 201e is $(1/16)z^{-1}(D_n)$, which when applied to an inverting input of adder 222 and combined with the output of adder 227 results in an output given by $(19/16)z^{-1}(D_n)$.

Logic 220 is further arranged to combine outputs from registers 202b and 202g in an adder 224, the latter output being first inverted. Register 202g is separated by six bits from the reference output $z^{-2}(D_n)$ of register 202a, so that the value on line 225 is $(1/2^6)z^{-2}(D_n)$, or $(1/64)z^{-2}(D_n)$. Since the output of register 202b is $\frac{1}{2}z^{-2}(D_n)$, the output of adder 224 is thus represented by $(31/64)z^{-2}(D_n)$.

When the output of adder 224 is combined in adder 223 with the inverted output from adder 222, the result on line 221 is a feedback signal given by $(-19/16)z^{-1} + (31/64)z^{-2}(D_n)$. This feedback signal is inverted and combined with the filter input $X_n$ to yield the state variable $D_n$ which is applied via clamp 250 to delay element 201.

That the feedback loop formed by delay elements 201 and 202, adder 213 and logic 220 have the desired overall transfer function specified in equation (8), can be demonstrated by noting that the output $D_n$ of adder 213 is:

$$D_n = X_n - \left( \frac{-19}{16} z^{-1} + \frac{31}{64} z^{-2} \right) D_n \quad (10)$$

so that:

$$\frac{D_n}{X_n} = \frac{1}{1 - \frac{19}{16} z^{-1} + \frac{31}{64} z^{-2}}. \qquad (11)$$

The logic 230 used to form the feedforward signal on line 231 is quite simple, comprising only adders 232 and 233. The output of adder 233 is the sum $(1+\frac{1}{4}) z^{-1}(D_n)$, formed by adding outputs from registers 201a and 201c of delay element 201. This value is subtracted from the output $z^{-2}(D_n)$ of register 202a of delay element 202, so that the feedforward signal on line 231 is $(-5/4)z^{-1}+z^{-2})(D_n)$. The output $X'_n$ of adder 210 on line 212, which is the overall output of filter section 200, is thus given by:

$$X'_n = D_n + \left( \frac{-5}{4} z^{-1} + z^{-2} \right) (D_n) \qquad (12)$$

and the transfer function for the feedforward section is:

$$\frac{X'_n}{D_n} = 1 + \left( \frac{-5}{4} z^{-1} + z^{-2} \right) \qquad (13)$$

as is desired.

The logic circuits 270 and 280 within the second filter section 260 are similar in complexity to the logic previously described, and, as stated above, are arranged to implement the denominator and numerator, respectively, of the term in the second brackets in equation (8).

The output from registers 290a and 290b of delay element 290 are combined in adder 271, the output of which is coupled to one input of adder 272. The output from register 290e is inverted and applied to the second input of adder 272, so that its output is given by $(23/16)z^{-1}(D'_n)$, where $D'_n$ is the value of the state variable present on line 265. Logic 270 also includes adder 275 which combines the outputs of registers 291a and 291d of delay element 291, the latter being inverted. The output of adder 275, which is given by $\frac{1}{8}z^{-2}(D'_n)$, is combined in adder 274 with the inverted output of register 291g, so that the input to adder 273 on line 276 is given by $(55/64)z^{-2}(D'_n)$. The overall feedback signal formed by adder 273 and applied on line 263 to adder 261 is thus given by $(-23/16)z^{-1}+(55/64)z^{-2})(D'_n)$. As desired, the transfer function between the input $X'_n$ and output $D'_n$ of adder 261 is given by $$\frac{D'_n}{X'_n} = \frac{1}{1 - \frac{23}{16} z^{-1} + \frac{55}{64} z^{-2}}. \qquad (14)$$

Logic 280 is somewhat simpler than logic 270 because the numerator of the second term in equation (8) includes fewer fractional coefficients. Specifically, the outputs of registers 290b and 290c of delay element 290 are combined in adder 281, the output of which is inverted and applied to one input of adder 282. The output of register 291a of delay element 291 is applied to the other input of adder 282, so that the feedforward signal formed by adder 282 on line 264 is given by $(-\frac{3}{4}z^{-1}+z^{-2})(D'_n)$. This feedforward signal is combined with $D'_n$ to yield the output $Y_n$ of filter section 260 on line 266. The overall input/output characteristic for this section is the second term in equation (8), as also desired.

As mentioned previously, the purpose of clamps 250 and 292 is to cause certain of the bits in each word applied to delay elements 201 and 290 to have the same value as the sign bit of that word, so that the carry circuits in the arithmetic operators of logic 220, 230, 270 and 280 need not be preset or reset at the beginning and end of each word. Clamps 250 and 292 are clocked at a word rate which is a predetermined fraction of the bit rate used to clock all remaining circuitry in the filter. The clamp is arranged to repeat or hold the current input for a predetermined number of bits, each time the clock lead is enabled, while with the clock lead low, the input is unaffected. For two's complement format, presetting occurs for each word by enabling the clock at the occurrence of the sign bit which follows the most significant bit. The clock stays high until the desired number of bits have been preset, and then goes low until the cycle is repeated for the next word. This repeating procedure will be described more fully below.

Figure 4:
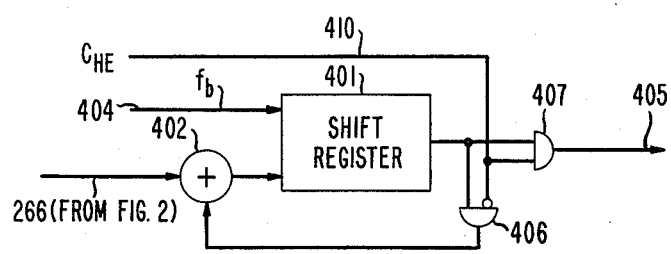
FIG. 4 is a block diagram of an accumulate and dump circuit which is used in conjunction with the filter of FIG. 2.

Referring to FIG. 4, an accumulate and dump circuit used in conjunction with the filter of FIG. 2 comprises a shift register 401 having its output connected to one input of an adder circuit 402 via a first AND gate 406. Register 401 includes a number of stages sufficient to store the number of bits in each input word processed in the filter. The other input to adder 402 on line 266 is the input to the accumulate and dump circuit, derived from the output of the filter of FIG. 2. The output of register 401 is connected to output line 405 via a second AND gate 407. Each time a bit rate clock pulse $f_b$ is applied to the shift input of register 401 on line 404, the output of adder 402 is shifted into the first stage of register 401, and the contents of the other stages are shifted one bit to the right. As long as AND gate 406 is enabled by a low timing signal $C_{HE}$ on line 410, the next input bit on line 266 is combined with the output of register 401 using adder 402, enabling further accumulation. This accumulation continues until $C_{HE}$ goes high. During the succeeding interval, the contents of register 401 are read out and applied to line 405 via gate 407, at each occurrence of an $f_b$ clock pulse. During this same interval, when $C_{HE}$ is high, AND gate 406 is disabled, thereby feeding a zero signal back to one input of adder 402. This in effect clears the signal that has been accumulated in register 401, and allows the first word in the next accumulation cycle to enter register 401. When $C_{HE}$ goes low, the foregoing cycle is repeated. The transfer characteristic for the accumulate and dump circuit of FIG. 4, when $C_{HE}$ is arranged to be low for three input word intervals and high for the fourth word interval, is given in equation (9) above.

Figure 5:
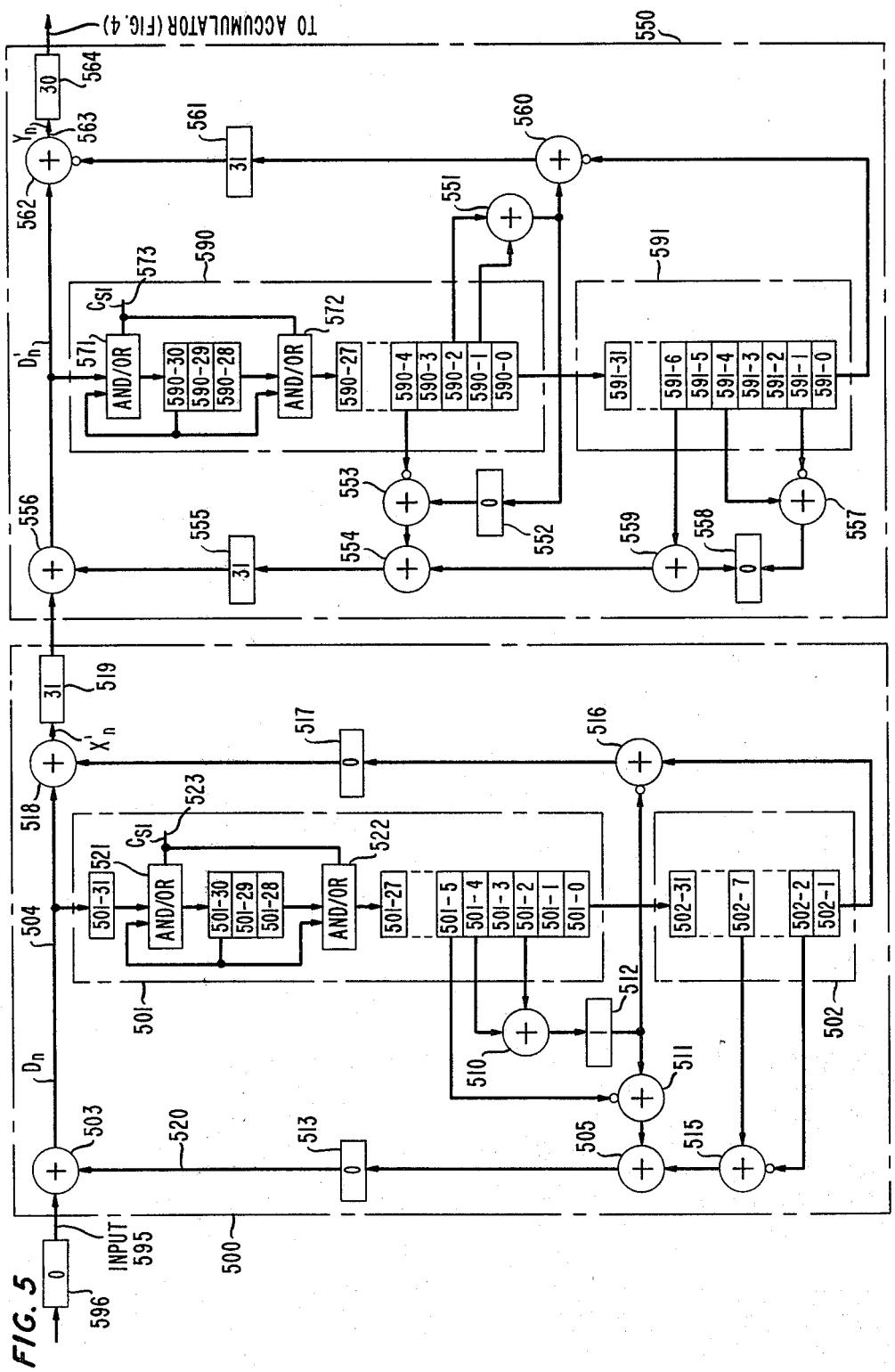
FIG. 5 is a diagram showing an arrangement of the filter of FIG. 2 which is better suited for integrated circuit fabrication.

FIG. 5 illustrates an implementation of the two-section second-order filter of FIG. 2 which includes certain modifications promoted by integrated circuit fabrication requirements and timing considerations. For example, it is desirable that no more than two arithmetic operations (additions or subtractions) occur before the signal is retimed in a register stage. Accordingly, the serial string of one-bit registers used for the delay elements 201, 202, 290 and 291 of FIG. 2 are somewhat "distributed" in FIG. 5 in order to accomplish this result. A second modification over the arrangement of FIG. 2 is the dual use of certain arithmetic operators. For example, adders 227 and 233 of FIG. 2 both provide the same output, and may be combined. In addition, the outputs of adders 271 and 281 differ by a factor of 2, and can be combined if a shift register is used to provide the needed multiplication.

In FIG. 5, it is assumed that the input words on line 595 contain 32 bits of which 16 bits signal essential information. The essential bits are preceded by three zero bits and are followed by 13 extensions of the sign bit. Since the words are in two's complement format, the value of the essential information in each word is thus not affected by the prefix or extension. The 32-bit words are accommodated in the delay elements 501, 502, within filter section 500 and delay elements 590, 591, within filter section 550 by insuring that each element includes a total of approximately 32 one-bit registers. As explained below, some of the registers making up the total may be distributed within the logic which makes up the remainder of each filter section. The registers in element 590 are designated 590-0 through 590-30, and the registers in the remaining elements are similarly numbered, with some delay elements containing 31 registers and others containing 32. Unlike the diagram of FIG. 2, the clamp circuits in each filter section in FIG. 5 are shown to comprise two AND/OR gates which are interposed between internal registers within the delay element in each section, rather than preceding each element. Additional one-bit shift registers are interposed between certain arithmetic circuits to accomplish the retiming function mentioned previously.

The AND/OR gates 521 and 522 used to repeat the sign bit of words processed in filter section 500 both derive an input from register 501-30. Gate 521 is interposed between registers 501-31 and 501-30, while gate 522 is interposed between registers 501-28 and 501-27. These gates each also receive a timing pulse $C_{S1}$ on line 523 occurring at the word rate $f_b/m$, which remains high for six bit intervals. When $C_{S1}$ is high, gates 521 and 522 are arranged to repeat whatever bit (one or zero) is presently in register 501-30. By maintaining $C_{S1}$ high for six bit intervals and by appropriately positioning the $C_{S1}$ pulse with respect to the beginning of each input word, the sign bit is thus extended backwardly a total of six times. Since the bit in register 501-30 is also moved forward two bits (by the connection between register 501-30 and gate 522) the total effect of both AND/OR gates is to repeat the sign bit in register 501-30 by presetting a total of 8 bits, two bits being forward and six bits being backward of the bit in register 501-30. The AND/OR gates 571 and 572 in filter section 550 are similarly configured, and operate in the same fashion, each receiving the same $C_{S1}$ timing pulse on line 573, and causing the desired number of bits in each word applied to delay element 590 to have the same value as the sign bit in register 590-30.

Figure 7:
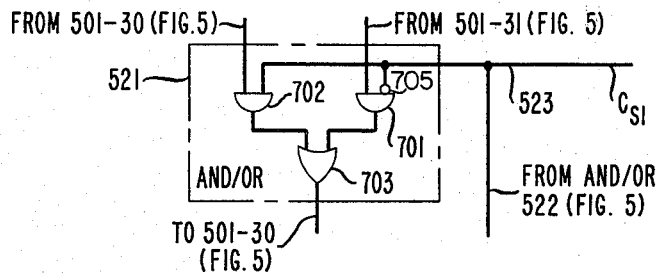
FIG. 7 is a logic diagram of AND/OR gate 521 of FIG. 5.

A logic diagram of AND/OR gate 521 is shown in FIG. 7. The gate includes two AND gates 701 and 702 and an OR gate 703. When $C_{S1}$ is low, AND gate 701 is enabled, (by virtue of inverter 705) and passes the input received from register 501-31 through to register 501-30 via OR gate 703. This is the normal mode, and no repeating occurs. When $C_{S1}$ goes high, AND gate 702 is enabled (while gate 701 is disabled) and the bit stored in register 501-30 is repeated by passing it back to the input of that register via gate 703. AND/OR gates 522, 572 and 573 are constructed similarly.

The logic which develops the feedback and feedforward signals in filter sections 500 and 550 is similar to that used in FIG. 2, and is also characterized by the use of adder and inverter circuits only, without the need for multipliers. The combination of inverters and adders serves to perform the subtraction operation where needed. All of the carry registers in the adder circuits are clocked at the same bit rate $f_b$ used to clock the one-bit registers, and the error resulting from carry values which exist in the arithmetic circuit between adjacent words is ignored.

The feedback signal developed in section 500 is formed by combining the outputs of registers 501-2 and 501-4 in adder 510 and applying the sum to one input of adder 511 via an additional one-bit shift register 512. The second input to adder 511 is derived from register 501-5, and is applied via an inverter. The output of adder 511 is applied via adder 505 and another one-bit shift register 513 to one input of adder 503, which combines the feedback signal with the input on line 590 to yield the state variable $D_n$ on line 504. The second-order portion of the feedback signal is derived by combining the outputs from registers 502-7 and 502-2 in adder 515, the latter being first inverted. The output of adder 515 is the second input to adder 505.

Verification that the desired poles and zeros are achieved using this logic arrangement is simple to illustrate. For example, the inputs to adder 515 are separated from a reference output $z^{-2}(D_n)$ taken from register 502-0 by two and seven bit positions, respectively. Accordingly, the output from register 502-7 is $(1/7)=(1/128)z^{-2}(D_n)$, and the output from register 502-2 is $\frac{1}{4}z^{-2}(D_n)$. When the output of adder 515, which is $(-31/128)z^{-2}(D_n)$, is further delayed by one-bit register 513, its value is doubled, so that the contribution to the feedback signal from this portion of the circuit is $(-31/64)z^{-2}(D_n)$ as desired. As another example, the output of adder 510 is $(5/16)z^{-1}(D_n)$, since with the output $z^{-1}(D_n)$ from register 501-0 as a reference, the output from register 501-4 is $(1/16)z^{-1}(D_n)$ and the output from register 501-2 is $\frac{1}{4}z^{-1}(D_n)$. The output from adder 510, after being delayed by register 512, is then given by $\frac{5}{8}z^{-1}(D_n)$. Since the output from register 501-5 is $(1/5)z^{-1}(D_n)$, the output of adder 511 is given by $(19/32)z^{-1}(D_n)$. This value is doubled after passing through register 513, yielding a contribution to the feedback signal given by $(19/16)z^{-1}(D_n)$.

The feedforward signal in filter section 500 includes components derived from the output of register 512 and from register 502-1 of delay element 502, both of which are input to adder 516. The output from register 512 is given by $\frac{5}{8}z^{-1}(D_n)$ and this value is inverted before application to adder 516. After passing through a one-bit register 517, the value of the feedforward signal applied to one input of adder 518 is $(5/4)z^{-1}(D_n)$, since register 517 doubles the input thereto. The second input to adder 516 derived from register 502-1 is given by $\frac{1}{2}z^{-2}(D_n)$ and this value also is doubled in register 517. Adder 518 combines the feedforward signal with the state variable $D_n$ on line 504 to yield the output of filter section 500, designated $X'_n$. A register 519 is disposed between the output of filter section 500 and the input to filter section 550 for purposes to be described below.

As in FIG. 2, filter section 550 resembles generally the previously described filter section 500, but the specific logic arrangement used is somewhat different so that the poles and zeros specified in the second bracketed term in equation (8) may be implemented. The feedback signal is formed by combining the output of registers 590-2 and 590-1 in an adder 551, the output of which is applied to register 552 and thence to one input of an adder 553. The second input to adder 553 is derived by inverting the output from register 590-4. The output of adder 553 is applied to one input of adder 554, the output of which is doubled in register 555 before being applied to one input of adder 556. The second-order feedback term is derived by combining the outputs of registers 591-4 and 591-1 in adder 557, the latter output being inverted. The output of adder 557 is doubled in register 558 and applied to a first input of adder 559, the other input of which is derived from register 591-6. The output of adder 559 is coupled to the second input of adder 554.

The foregoing logic produces the denominator in the second bracketed term in equation (8). Specifically, using the output of register 590-0 as a reference, the output of adder 551 is $\frac{3}{4}z^{-1}(D_n)$ and this value is doubled in register 552. The output from register 590-4 is $(1/16)z^{-1}(D'_n)$ so that the output from adder 553 is $(23/16)z^{-1}(D'_n)$. Using the output of register 590-0 as a reference, the contribution toward the second-order term derived from adder 557 is $(7/16)z^{-2}(D'_n)$ and this value is doubled in register 558. The output from register 591-6 is $(1/64)z^{-2}(D'_n)$ so that the output from adder 559 is given by $(55/64)z^{-2}(D'_n)$. The denominator is thus formed as desired.

The feedforward signal in filter section 550 is provided by applying the output of adder 551 to one input of adder 560, the other input of which is the inverted output from register 591-0. The output of adder 560 is $[\frac{3}{4}z^{-1}-z^{-2}](D'_n)$ and this is the desired numerator for the second term in equation (8). Register 561 interposed in the feedforward line and register 555 interposed in the feedback line of filter section 550 do not have the effect of doubling the inputs thereto, since delay element 590 contains 31 one-bit registers 590-0 through 590-30, and registers 555 and 561 are, in effect, the 32nd registers in this delay element, with respect to the feedback and feedforward signals, respectively. Adder 562 combines $D'_n$ and the feedforward signal to yield the overall filter output $Y_n$ on line 563. A register 564 is inserted in the output line, if desired, for gain stabilization purposes.

Arithmetic circuits used in the filter sections of FIG. 5 are arranged so that no more than two adders occur in series. By inserting one-bit shift registers where required, the words being processed in the filter are in effect retimed, thus preventing delay buildup. In FIG. 5, the numbers within these "extra" registers (registers 512, 513, 517, 519, 552, 555, 558, 561, 564 and 596) indicate the relative time position of bits stored therein at a reference time when the first bit of one input word is present on line 595. For example, if each input word consists of 32 bits numbered from 0 to 31, then the first (0) bit of the input word is combined with the first bit of the feedback word on line 520, when the outputs of registers 513 and 596 are applied to adder 503. Similarly, the inputs to adder 556 are derived from registers 519 and 555, both of which contain the last (31st) bit of the previously processed word.

The location of the significant data bits and sign bits in different parts of the filter of FIG. 5 is illustrated in the following table.

| Line No. | Description | TIME → |
|---|---|---|
| 1 | Input 595 | — — — # # # # # # # # # # # # # # # # S S S S S S S S S S S S S S — — |
| 2 | $D_n$ | J J — — # # # # # # # # # # # # # # # # # # S S S S S J J J J J J J |
| 3 | Output of Gate 521 | S J J — — # # # # # # # # # # # # # # # # # # S S Ⓢ S S S S S S J |
| 4 | $X'_n$ | J J — — # # # # # # # # # # # # # # # # # # S S S S S S J J J J J J J |
| 5 | $D'_n$ | J J J J J — # # # # # # # # # # # # # # # # # # S S S J J J J J J J |
| 6 | Output of Gate 571 | S J J J J — # # # # # # # # # # # # # # # # # # S S Ⓢ S S S S S S J |
| 7 | $Y_n$ | J J J J J — # # # # # # # # # # # # # # # # # # # S S S J J J J J J J |
|   |   | Least Significant Bits      Most Significant Bits |

Line 1 in the table indicates that each input word on line 595 includes 16 significant bits indicated by the "#" symbol, occurring least significant bit first, followed by 13 repetitions of the sign bit, indicated by "S". Each word is preceded by three zero bits, indicated by a "-".

During processing, the input words can be somewhat distorted, as explained previously, due to the fact that the carry logic within the arithmetic circuits of the filters are neither preset nor cleared at the beginning of each input word. Accordingly, line 2 in the table shows that the state variable $D_n$ on line 504 includes the significant data bits designated "#", followed by five sign bits "S", but that seven possible errors designated "J" for "JUNK" have crept into the word. The number of erroneous bits introduced depends upon the value of the coefficients used within the filter. In accordance with the present invention, the filter uses coefficients expressed by no more than six bits, since as explained previously, the inputs to the logic circuits used to form the feedback and feedforward signals are obtained from registers in the delay elements which precede the final (reference) registers by no more than six bit positions. With this arrangement, the maximum number of erroneous bits is about six. However, to be absolutely certain that overflow and limit cycles are also eliminated, a total of eight bits are preset using the arrangement of FIG. 5. When the erroneous word is applied to AND/OR gates 521 and 522 within filter section 500, clock signal $C_{S1}$ is arranged to go high when the sign bit indicated by a circle in the table is in register 501-30. This signal remains high for the next six bits, so that the sign bit is repeated six times. The same sign bit is also extended two bits forwardly, as described above, so that the word output from AND/OR gate 521, shown on line 3 of the table, thus does not include most of the "JUNK" that had entered the state variable $D_n$. After further processing, each output $X'_n$ from filter section 500 is a word of the type shown on line 4 of the table, where again the errors "J" have entered the end portion of each word. These errors are present but delayed in the state variable $D'_n$, shown on line 5 of the table, the delay being associated with registers 519 and 555.

In filter section 550, the errors are again eliminated by AND/OR gates 571 and 572, the latter of which has an output shown on line 6 of the table. These AND/OR gates are provided with a $C_{S1}$ timing pulse which is high for six-bit intervals, beginning when the encircled bit (on line 6 of the table) is in register 590-30. The overall filter output $Y_n$ on line 563, shown on line 7 of the table, again includes error bits. However, these "J" bits have not entered or interferred with the essential "#" bits and, indeed, a margin of three uncontaminated sign "S" bits is provided.

Figure 6:
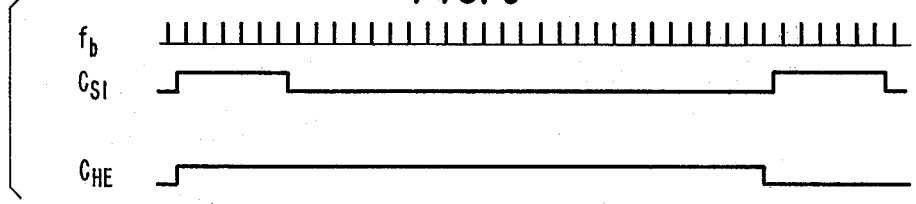
FIG. 6 is a timing diagram showing the clock signals used in a filter arranged in accordance with the present invention.

A timing diagram for the filter of FIG. 5 is shown in FIG. 6. All of the registers within delay elements 501, 502, 590 and 591, as well as the carry registers in the adder circuits are clocked at the bit rate $f_b$. AND/OR gates 521, 522, 571 and 572 are clocked for six bit intervals by a $C_{S1}$ timing signal, which stays high for six bit intervals. Every fourth $C_{S1}$ signal produces the timing signal designated $C_{HE}$ which operates the AND gates 406 and 407 within the accumulate and dump circuit of FIG. 4. $C_{HE}$ is high for one word interval.

Although the arrangement described above results in longer words within the filter sections and requires extra stages of delay, the clocking and management of information within the filter is greatly simplified. This is particularly advantageous where the filter is to be fabricated in integrated circuit form. The one-bit registers which form the delay elements are regular in structure and can be densely packed, while, by comparison, clocking and other data handling functions are generally of an irregular nature, and lay out inefficiently. Expression of the filter coefficients as short words (six bits or less) is quite significant in the present invention, and the transfer function expressed in equation (8) represents a significant improvement over arrangements heretofore used. If longer coefficients are required, the number of sign bits to be preset or repeated by the clamping circuits must be varied accordingly. In general, if outputs from the last "1" registers are used to form the feedback and feedforward signals, then the filter should be arranged so that at least "1" bits in each word are caused to assume the same value as the sign bit of that word.

Various modifications and adaptations of the present invention will be readily apparent to those skilled in the art. For example, although the input words are desirably expressed in two's complement format, other formats such as sign magnitude arithmetic can also be used. However, this necessitates modification of some of the arithmetic elements. In other instances, it may be desirable to configure the filter in other classical forms that are functionally equivalent to the section of FIG. 1. As explained previously, the two filter sections described in FIG. 5 can be used separately, or in conjunction with still other filter apparatus.

We claim:

1. Apparatus for filtering an input signal comprising a series of multibit input words, each of said words including an essential portion, a sign bit, and at least L repetitions of said sign bit, said apparatus including:
   first and second serially connected delay elements (201, 202) each arranged to store the number of bits contained in one of said input words;
   logic means (220, 230) for combining selected ones of the last L bits stored in each of said delay elements in accordance with first and second predetermined relationships to generate feedback and feedforward signals, respectively,
   first means (213) for combining, bit by bit, said feedback signal with said input signal to yield an intermediate signal, and
   second means (210) for combining, bit by bit, said intermediate signal with said feedforward signal to yield the output signal of said filter,
   characterized in that said apparatus includes means (250) responsive to said intermediate signal for forming the input to said first delay element, said means arranged to repeat the last L predetermined bits in each word of said intermediate signal to have the same value as the sign bit of said each word.

2. The invention defined in claim 1 wherein said logic means comprises adder and inverter circuits, and said delay elements each comprise a series of one-bit registers.

3. The invention defined in claim 2 wherein the bits of said input words are timed by a sequence of clock pulses generated by a clock at a bit rate $f_b$, and said registers and said adder circuits are arranged to receive clock pulses at the same bit rate $f_b$.

4. The invention defined in claim 3 wherein said apparatus includes means for generating pulses at a rate $f_b/m$, where m is the number of bits in each of said input words and means (250) is arranged to receive timing pulses generated by said timing pulse generating means.

5. The invention defined in claim 1 wherein said logic means is arranged such that said output signal of said filter is related to said input signal in accordance with the transfer function:

$$\frac{Y_n}{X_n} = \frac{1 - \frac{5}{4} z^{-1} + z^{-2}}{1 - \frac{19}{16} z^{-1} + \frac{31}{64} z^{-2}}$$

where $Y_n$ is the z-transform of said output signal of said filter, $X_n$ is the z-transform of said input signal, and $z^{-1}$ and $z^{-2}$ indicate delays by one and two word intervals, respectively.

6. The invention defined in claim 1 wherein said logic means is arranged such that said output signal of said filter is related to said input signal in accordance with:

$$\frac{Y_n}{X_n} = \frac{1 - \frac{3}{4} z^{-1} + z^{-2}}{1 - \frac{23}{16} z^{-1} + \frac{55}{64} z^{-2}}$$

where $Y_n$ is the z-transform of said output signal of said filter, $X_n$ is the z-transform of said input signal, and $z^{-1}$ and $z^{-2}$ indicate delays by one and two word intervals, respectively.

7. A digital filter comprising at least two second order recursive filter sections connected in series, each of said filter sections including:
   means for receiving, bit by bit, a series of multibit input words, each of said words including a total of m bits, of which n bits contain significant information, one bit is the sign of said information, and L bits are extensions of said sign bit,
   output means,
   a multibit delay element,
   means for combining a first series of bits stored in said delay element in accordance with a first series of predefined relationships to generate a first signal,
   means for generating an intermediate word by arithmetically combining bits of each of said input words with bits from said first signal, first means for applying said intermediate word, bit by bit, to said delay element;

means for combining a second series of bits stored in said delay element in accordance with a second series of predefined relationships to generate a second signal, means for combining bits of said intermediate word with bits from said second signal, and second means for applying the resulting combined word, bit by bit, to said output means, wherein said first applying means includes means for replacing, in every intermediate word, certain bits of said intermediate word with the sign of each of said words.

8. The invention defined in claim 7 wherein said delay element includes first and second groups of m serially connected one-bit shift registers.

9. The invention defined in claim 8 wherein said first and second combining means are arranged so that said first and second series of bits are obtained from different sets of the last L registers in each of said first and second groups.

10. The invention defined in claim 9 wherein the transfer function of said filter is given by:

$$\frac{Y_n}{X_n} = \left( \frac{1 - \frac{5}{4}z^{-1} + z^{-2}}{1 - \frac{19}{16}z^{-1} + \frac{31}{64}z^{-2}} \right) \left( \frac{1 - \frac{3}{4}z^{-1} + z^{-2}}{1 - \frac{23}{16}z^{-1} + \frac{55}{64}z^{-2}} \right)$$

where $Y_n$ is the z-transform of said output signal of said filter, $X_n$ is the z-transform of said input signal, and $z^{-1}$ and $z^{-2}$ indicate delays by one and two word intervals, respectively.

11. Apparatus for generating a series of multibit output words $Y_n$ in response to a series of multibit input words $X_n$, such that $$\frac{Y_n}{X_n} = \frac{1 - \alpha_1 z^{-1} + \alpha_2 z^{-2}}{1 - \beta_1 z^{-2} + \beta_2 z^{-2}}$$

where $\alpha_1$, $\alpha_2$, $\beta_1$ and $\beta_2$ are predetermined coefficients and $z^{-1}$ and $z^{-2}$ indicate delays by one and two word intervals, respectively, comprising:

(1) a delay element having a total storage capacity equal to the number of bits in two of said input words;

(2) logic means for combining selected ones of the bits stored in said delay element to form feedback and feedforward signals;

(3) means for combining said feedback signal with said input word, on a bit by bit basis, to form an intermediate signal;

(4) means for combining said feedforward signal with said intermediate signal, on a bit by bit basis, to form said output words; and (5) means for applying said intermediate signal to said delay element, wherein said logic means is a plurality of adder circuits and one-bit registers each timed only by a single sequence of clock pulses occurring at a rate equal to the rate at which signals are advanced through said delay element.

12. The invention defined in claim 11 wherein said applying means includes means for setting a predetermined number of bits in each word of said intermediate signal equal in value to the sign of said each word.

13. The invention defined in claim 12 wherein said delay element includes first and second delay circuits each comprising a chain of serially connected one-bit registers, and said selected bits are stored in certain ones of the last L registers in said first and second delay circuits, where L is said predetermined number of bits.

14. A digital filter for processing a series of signed multibit input words $X_n$ to generate a series of multibit output words $Y_n$, such that $$\frac{Y_n}{X_n} = \frac{1 - \alpha_1 z^{-1} + \alpha_2 z^{-2}}{1 - \beta_1 z^{-2} + \beta_2 z^{-2}}$$

where $\alpha_1$, $\alpha_2$, $\beta_1$, and $\beta_2$ are predetermined coefficients and $z^{-1}$ and $z^{-2}$ indicate delays by one and two word intervals, respectively, including:

means for providing a delay equal to two input word intervals;

means for producing feedback and feedforward words which are the products of words stored in said delay means and different ones of said filter coefficients;

first means for arithmetically combining each of said input words with an associated one of said feedback words to yield an intermediate word;

second means for arithmetically combining each of said intermediate words with an associated feedforward word to form one of said output words; and means for forming the input applied to said delay means by modifying selected bits of each of said intermediate words so as to replace said selected bits with its sign bit.

* * * * *